(12) United States Patent
Um et al.

(10) Patent No.: US 10,330,984 B2
(45) Date of Patent: Jun. 25, 2019

(54) ARRAY SUBSTRATE AND FABRICATION METHOD THEREOF, AND DISPLAY DEVICE

(71) Applicant: BOE Technology Group Co., Ltd., Beijing (CN)

(72) Inventors: Yoon Sung Um, Beijing (CN); Yun Sik Im, Beijing (CN); Hyun Sic Choi, Beijing (CN); Hui Li, Beijing (CN); Jung Mok Jun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 279 days.

(21) Appl. No.: 15/291,585

(22) Filed: Oct. 12, 2016

(65) Prior Publication Data

US 2017/0123276 A1    May 4, 2017

(30) Foreign Application Priority Data

Oct. 29, 2015    (CN) .......................... 2015 1 0719680

(51) Int. Cl.
```
G02F 1/1343    (2006.01)
G02F 1/1337    (2006.01)
G02F 1/1333    (2006.01)
G02F 1/1368    (2006.01)
H01L 27/12     (2006.01)
```
(52) U.S. Cl.
CPC ...... *G02F 1/133784* (2013.01); *G02F 1/1368* (2013.01); *G02F 1/13439* (2013.01); *G02F 1/133345* (2013.01); *G02F 1/133707* (2013.01); *G02F 1/134309* (2013.01); *G02F 1/134363* (2013.01); *H01L 27/1248* (2013.01); *H01L 27/1259* (2013.01); *G02F 2001/134318* (2013.01); *G02F 2201/121* (2013.01); *G02F 2201/123* (2013.01)

(58) Field of Classification Search
CPC ......... G02F 1/133784; G02F 1/134363; G02F 2001/133354; G02F 2001/134318; G02F 1/13
See application file for complete search history.

(56) References Cited

U.S. PATENT DOCUMENTS

| | | | | |
|---|---|---|---|---|
| 6,819,375 B2 * | 11/2004 | Wachi | ............... | G02F 1/133514 349/106 |
| 9,377,658 B2 * | 6/2016 | Tamaki | ............ | G02F 1/134363 |
| 9,632,363 B2 * | 4/2017 | Li | ..................... | G02F 1/133784 |

(Continued)

*Primary Examiner* — William F Kraig
*Assistant Examiner* — Khatib A Rahman
(74) *Attorney, Agent, or Firm* — Banner & Witcoff, Ltd.

(57) ABSTRACT

An array substrate and a fabrication method thereof, and a display device are provided. The array substrate comprises a lining substrate and an electrode pattern formed on the lining substrate, and the electrode pattern includes a plurality of strip-shaped electrodes. There are a plurality of strip-shaped protrusions on an upper surface of the lining substrate, and at least part of strip-shaped electrodes among the plurality of strip-shaped electrodes are formed on the strip-shaped protrusions one-to-one; and there is an included angle between an extending direction of the strip-shaped electrodes and an extending direction of the strip-shaped protrusions, and the included angle is configured so that a rubbing direction of an alignment film is along the extending direction of the strip-shaped protrusions.

13 Claims, 7 Drawing Sheets

(56) References Cited

U.S. PATENT DOCUMENTS

| | | | | |
|---|---|---|---|---|
| 2009/0033821 A1* | 2/2009 | Lee | ............ | G02F 1/134309 349/48 |
| 2009/0310072 A1* | 12/2009 | Morii | ............ | G02F 1/133753 349/126 |
| 2011/0007252 A1* | 1/2011 | Hashimoto | ......... | G02F 1/13363 349/114 |
| 2014/0267970 A1* | 9/2014 | Kuki | ............ | G02F 1/1339 349/47 |

* cited by examiner

ARRAY SUBSTRATE AND FABRICATION METHOD THEREOF, AND DISPLAY DEVICE

This application claims priority to and the benefit of Chinese Patent Application No. 201510719680.7 filed on Oct. 29, 2015, which application is incorporated herein in its entirety.

TECHNICAL FIELD

Embodiments of the present disclosure relate to an array substrate and a fabrication method thereof, and a display device.

BACKGROUND

A liquid crystal display device is a commonly used flat-panel display device at present. Generally, the liquid crystal display device includes an array substrate and an opposed substrate and a liquid crystal layer sandwiched between the array substrate and the opposed substrate. For example, the opposed substrate is a color filter substrate where a color filter layer has been formed.

SUMMARY

According to embodiments of the disclosure, an array substrate is provided. The array substrate comprises a lining substrate and an electrode pattern formed on the lining substrate, and the electrode pattern includes a plurality of strip-shaped electrodes. There are a plurality of strip-shaped protrusions on an upper surface of the lining substrate, and at least part of strip-shaped electrodes among the plurality of strip-shaped electrodes are formed on the strip-shaped protrusions one-to-one; and there is an included angle between an extending direction of the strip-shaped electrodes and an extending direction of the strip-shaped protrusions, and the included angle is configured so that a rubbing direction of an alignment film is along the extending direction of the strip-shaped protrusions.

For example, the electrode pattern includes a common electrode pattern and/or a pixel electrode pattern.

For example, the lining substrate includes a base substrate, an array of a thin film transistor formed above the base substrate and a passivation layer formed above the thin film transistor array; and the plurality of strip-shaped protrusions are formed on an upper surface of the passivation layer.

For example, the array of the thin film transistor includes a gate insulating layer; and the strip-shaped protrusions are formed by the passivation layer and the gate insulating layer.

For example, the included angle is less than 10.5° and greater than 9.5°.

For example, the array substrate further comprises the alignment film formed above the lining substrate and the electrode pattern, and the alignment film is formed by rubbing a material of the alignment film along the extending direction of the strip-shaped protrusions.

For example, pixel electrodes of the pixel electrode pattern are formed on the strip-shaped protrusions, and common electrodes of the common electrode pattern are not formed on the strip-shaped protrusions.

For example, common electrodes of the common electrode pattern are formed on the strip-shaped protrusions, and pixel electrodes of the pixel electrode pattern are not formed on the strip-shaped protrusions.

According to the embodiments of the disclosure, a fabrication method of an array substrate is provided. The method comprises: providing a lining substrate having a plurality of strip-shaped protrusions on an upper surface thereof; and forming an electrode pattern on the lining substrate. The electrode pattern includes a plurality of strip-shaped electrodes, and at least part of strip-shaped electrodes among the plurality of strip-shaped electrodes are formed on the strip-shaped protrusions one-to-one; and there is an included angle between an extending direction of the strip-shaped electrodes and an extending direction of the strip-shaped protrusions, and the included angle is configured so that a rubbing direction of an alignment film is along the extending direction of the strip-shaped protrusions.

For example, the electrode pattern includes a common electrode pattern and/or a pixel electrode pattern.

For example, the included angle is less than 10.5° and greater than 9.5°.

For example, the method further comprises: forming a material of the alignment film above the lining substrate and the electrode pattern; and rubbing the material of the alignment film along the extending direction of the strip-shaped protrusions to obtain the alignment film.

According to embodiments of the disclosure, a display device is provided. The display device comprises the array substrate as described above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Figure 1:
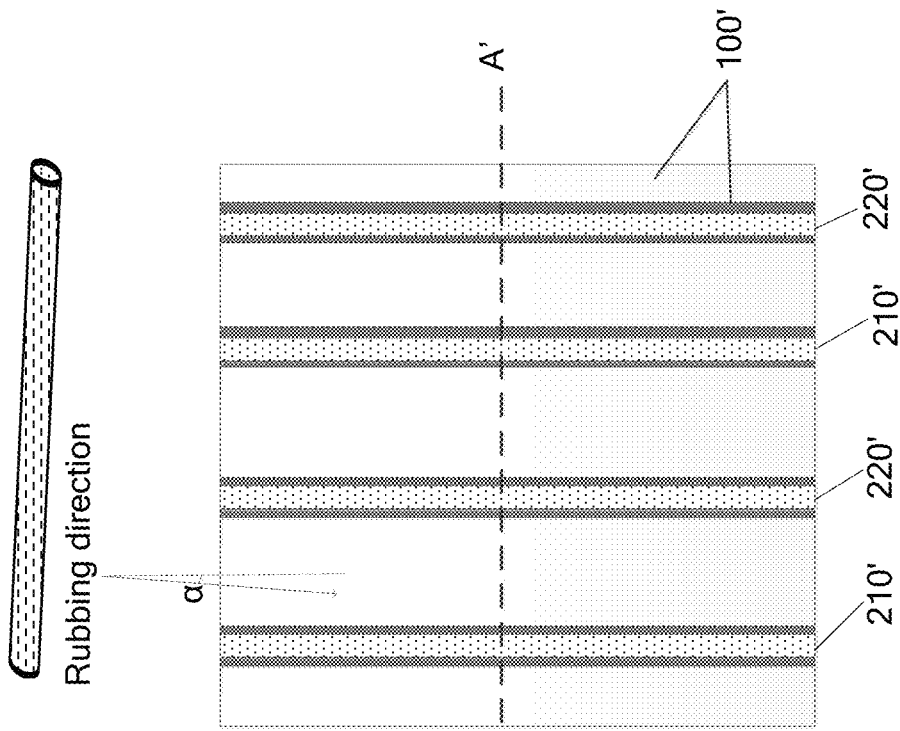
FIG. 1 is a structural schematic diagram of an array substrate according to one technique.
Figure 1:
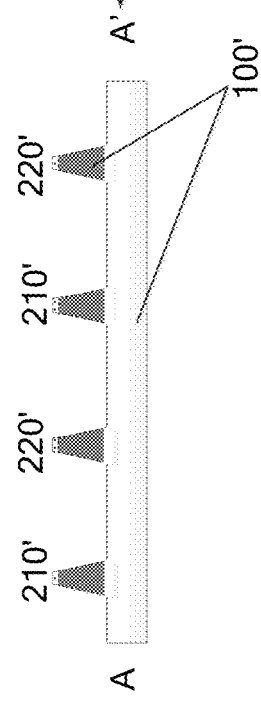

Referring to FIG. 1, an array substrate of a liquid crystal display device includes a lining substrate 100' and strip-shaped pixel electrodes 210' and strip-shaped common electrodes 220' formed on the lining substrate 100'. There are a plurality of strip-shaped protrusions formed on an upper surface of the lining substrate 100'; for convenience of understanding, the strip-shaped protrusions and the other portions except for the strip-shaped protrusions of the lining substrate 100' are indicated by different patterns. The respective strip-shaped electrodes 210' and 220' are correspondingly located on the respective strip-shaped protrusions, and have same extending directions as those of the strip-shaped protrusions. Generally, in order to ensure normal display of the liquid crystal display device, it is necessary to form an alignment film on the strip-shaped electrodes 210' and 220' and form an included angle α between a rubbing direction of the alignment film and the extending directions of the strip-shaped electrodes 210' and 220'. Referring to FIG. 1, at the time of rubbing the alignment film, it is required that the included angle α is formed between the rubbing direction and the strip-shaped electrodes 210' and 220', that is, the included angle is formed between the rubbing direction and the strip-shaped protrusions. However, since the strip-shaped protrusions protrude from the lining substrate 100', the alignment film at the position of the strip-shaped protrusions is not fully rubbed, such that the included angle between the rubbing striation formed at such position and the extending direction of the strip-shaped electrodes does not meet requirements, thereby causing light leakage.

According to embodiments of the present disclosure, there is provided an array substrate, comprising: a lining substrate and an electrode pattern formed on the lining substrate; the electrode pattern including a plurality of strip-shaped electrodes. There are a plurality of strip-shaped protrusions on an upper surface of the lining substrate, and at least part of strip-shaped electrodes among the plurality of strip-shaped electrodes are formed on the strip-shaped protrusions one-to-one; there is an included angle between an extending direction of the strip-shaped electrodes and an extending direction of the strip-shaped protrusions, and the included angle is configured so that a rubbing direction of an alignment film is along the extending direction of the strip-shaped protrusions.

There is the included angle between the extending direction of the strip-shaped electrodes and the extending direction of the strip-shaped protrusions in the embodiments of the present disclosure, and the included angle is configured so that the rubbing direction of the alignment film is along the extending direction of the strip-shaped protrusions. In this way, at the time of rubbing the alignment, the rubbing is performed along the extending direction of the strip-shaped protrusions, so as to eliminate the influence of the strip-shaped protrusions protruding from the lining substrate on the rubbing of the alignment film, thereby avoiding light leakage.

According to the embodiments of the present disclosure, there is further provided a fabrication method of an array substrate, comprising: providing a lining substrate having a plurality of strip-shaped protrusions on an upper surface thereof; forming an electrode pattern on the lining substrate, the electrode pattern including a plurality of strip-shaped electrodes, at least part of strip-shaped electrodes among the plurality of strip-shaped electrodes being formed on the strip-shaped protrusions one-to-one. There is an included angle between an extending direction of the strip-shaped electrodes and an extending direction of the strip-shaped protrusions, and the included angle is configured so that a rubbing direction of an alignment film is along the extending direction of the strip-shaped protrusions.

It should be noted that, a specific structure of the array substrate described above may be implemented in many different forms, and corresponding fabrication methods may be different. Hereinafter, the array substrate and the fabrication method thereof according to the embodiments of the present disclosure will be specifically described in conjunction with the accompanying drawings.

Example 1

Figure 2:
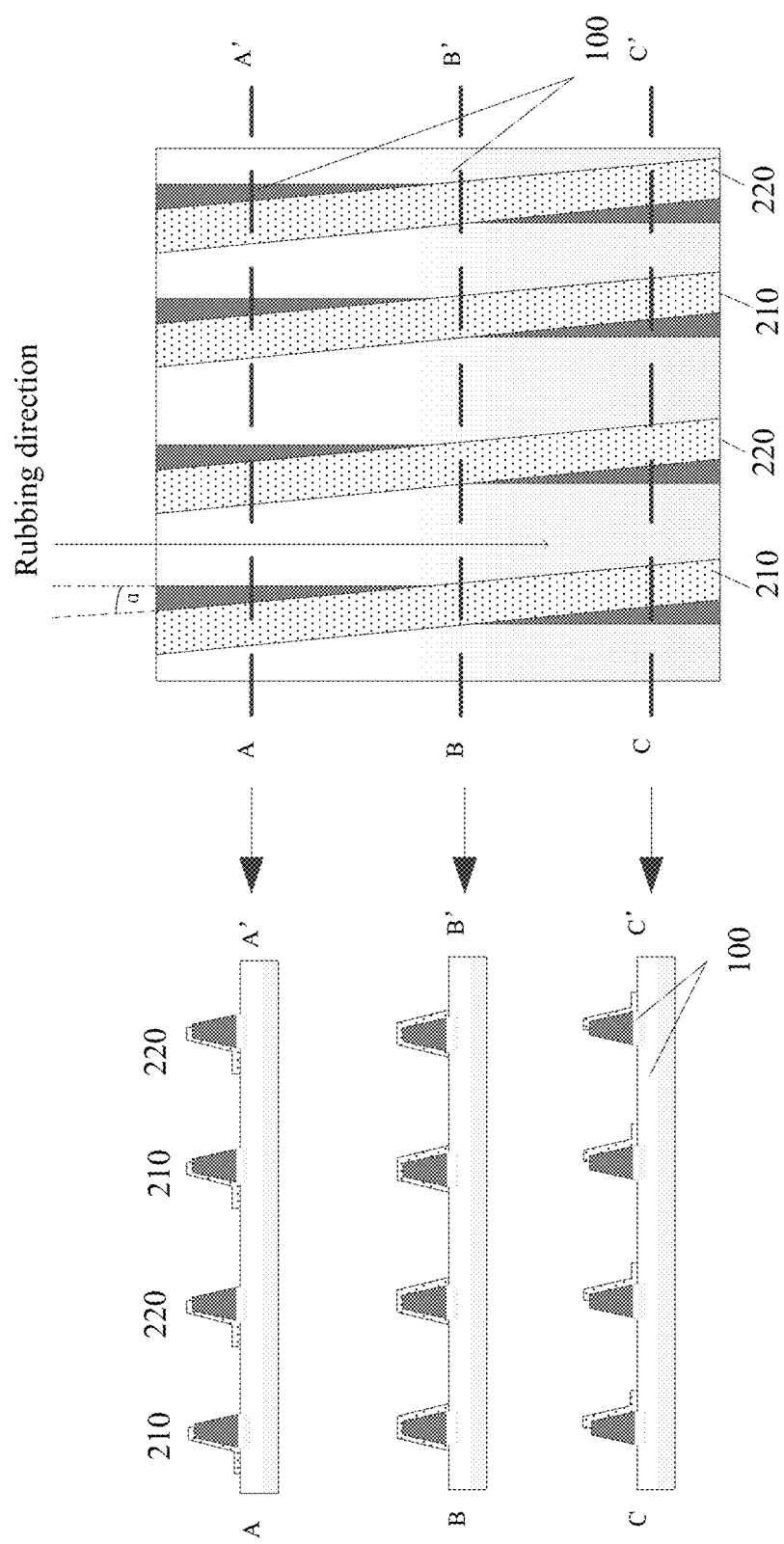
FIG. 2 is a structural schematic diagram of an array substrate provided by Example 1 of embodiments of the present disclosure.

A structural schematic diagram of the array substrate provided by Example 1 of the embodiments of the present disclosure is shown in FIG. 2. As shown in FIG. 2, the array substrate comprises: a lining substrate 100, and pixel electrodes 210 and common electrodes 220 formed on the lining substrate 100. There are a plurality of strip-shaped protrusions formed on an upper surface of the lining substrate 100, and the pixel electrodes 210 and the common electrodes 220 are all strip-shaped and are formed on the strip-shaped protrusions one-to-one. The pixel electrodes 210 and the common electrodes 220 are arranged alternately; and a width of each strip-shaped electrode 210 and 220 is greater than a width of its corresponding strip-shaped protrusion.

Referring to FIG. 2, there is an included angle α between an extending direction of the strip-shaped pixel electrodes 210 and the strip-shaped common electrodes 220 and an extending direction of the strip-shaped protrusions, and the included angle α is configured so that a rubbing direction of an alignment film is along the extending direction of the strip-shaped protrusions. That is, by forming the included angle α between the extending direction of the strip-shaped pixel electrodes 210 and the strip-shaped common electrodes 220 and the extending direction of the strip-shaped protrusions, the included angle α is formed between a striation obtained by rubbing the alignment film and the pixel electrodes 210 and the common electrodes 220 to make a display device display normally in the case that the alignment film is rubbed along the extending direction of the protrusions. In this way, at the time of rubbing the alignment film, the alignment film is rubbed along the extending direction of the strip-shaped protrusions, so as to prevent the rubbing of the alignment film from being affected by the height difference of the lining substrate caused by the strip-shaped protrusions, thereby avoiding light leakage phenomenon.

For example, a value of the included angle α is less than 10.5° and greater than 9.5°. Within the range, the light leakage of the display device is further avoided.

Figure 3:
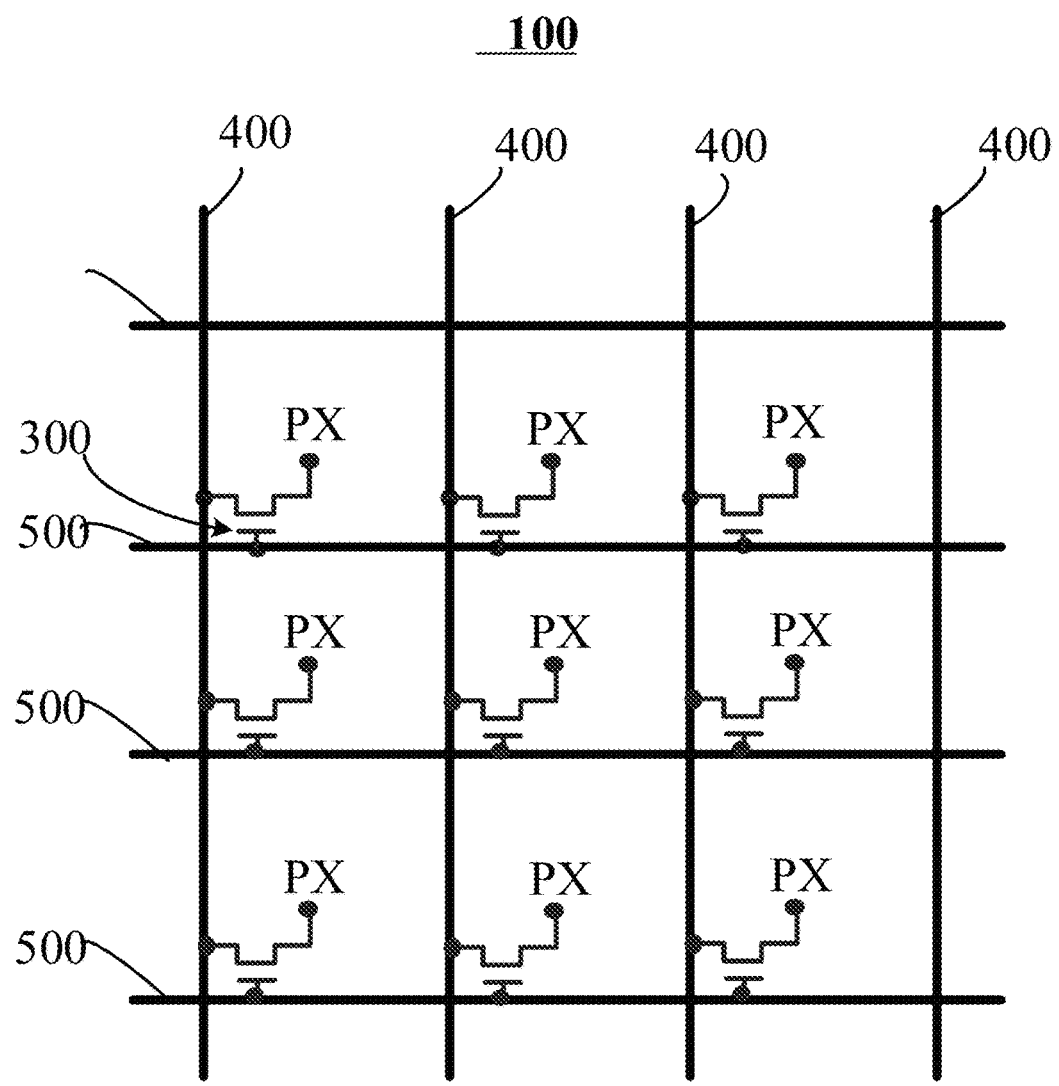
FIG. 3 is a top view of a lining substrate of the array substrate provided by the embodiments of the present disclosure.
Figure 4:
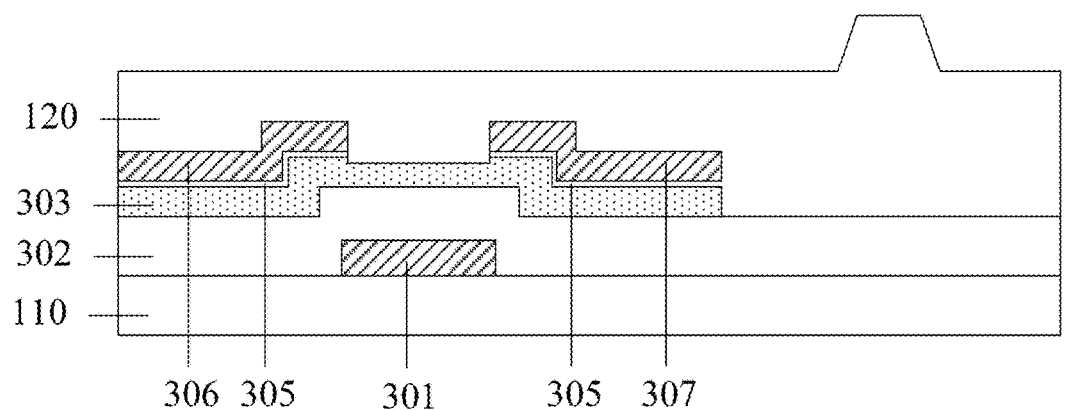
FIG. 4 is a cross-sectional schematic diagram of the lining substrate of the array substrate provided by the embodiments of the present disclosure.

For example, as shown in FIG. 3 and FIG. 4, the lining substrate 100 includes a base substrate 110, an array of a thin film transistor 300 formed on the base substrate 110 and a passivation layer 120 formed on the array of the thin film transistor 300. On the base substrate 110, a plurality of data lines 400 and a plurality of gate lines 500 intersect with each other to define a plurality of pixel units, and each pixel unit includes the thin film transistor 300 and a pixel electrode. The thin film transistor 300 includes a gate electrode 301, an active layer 303, a source electrode 306 and a drain electrode 307. The gate electrode 301 of the thin film transistor 300 and its corresponding gate line 500 are connected with each other or are formed integrally, the source electrode 306 of the thin film transistor 300 and its corresponding data line 400 are connected with each other or formed integrally, and the drain electrode 307 of the thin film transistor 300 is connected with the pixel electrode PX. For example, the pixel electrode PX comprises the strip-shaped pixel electrodes 210. For example, the thin film transistor 300 further includes an ohmic contact layer 305 located between the source electrode 306 and the active layer 303 and located between the drain electrode 307 and the active layer 303, to reduce a contact resistance between the source electrode 306 and the active layer 303 and a contact resistance between the drain electrode 307 and the active layer 303.

For example, as shown in FIG. 4, the passivation layer 120 forms an uppermost layer of the lining substrate 100, and there are a plurality of strip-shaped protrusions on an upper surface of the passivation layer 120.

For example, the thin film transistor 300 array further includes a gate insulating layer 302 provided between the gate electrode 301 and the active layer 303; and in this case, the strip-shaped protrusions described above for example are formed by the passivation layer 120 and the gate insulating layer 302. For example, the passivation layer 120 is located above the gate insulating layer 302, and there are strip-shaped protrusions on an upper surface of the gate insulating layer 302, such that there also are strip-shaped protrusions on the upper surface of the passivation layer 120 located on the gate insulating layer 302. For example, the strip-shaped protrusions are only formed by the passivation layer 120, and in this case, an insulating layer below the passivation layer 120 does not form any protrusion. In a case that the strip-shaped protrusions include the gate insulating layer 302 and the passivation layer 120, an overall thickness of the strip-shaped protrusions for example is in a range of 0.6 to 1.0 μm; and in a case that the strip-shaped protrusions only include the passivation layer 120, the overall thickness of the strip-shaped protrusions for example is in a range of 0.2 to 0.6 μm.

For example, the array substrate described above further comprises: an alignment film formed above the lining substrate and the electrode pattern, the alignment film is formed by rubbing a material of the alignment film along the extending direction of the strip-shaped protrusions.

For the array substrate of Example 1, a fabrication method thereof for example comprises:

Step S1: providing a lining substrate having a plurality of strip-shaped protrusions on an upper surface thereof;

For example, the lining substrate includes a base substrate, an array of a thin film transistor and a passivation layer are formed on the base substrate, and the plurality of strip-shaped protrusions are formed on an upper surface of the passivation layer.

Step S2: forming an electrode pattern on the lining substrate; the electrode pattern including a pixel electrode pattern and a common electrode pattern. For example, both the pixel electrode pattern and the common electrode pattern include a plurality of strip-shaped electrodes, and the plurality of strip-shaped electrodes are formed on the plurality of strip-shaped protrusions one-to-one; and there is an included angle between an extending direction of the strip-shaped electrodes and an extending direction of the strip-shaped protrusions, and the included angle is configured so that a rubbing direction of an alignment film is along the extending direction of the strip-shaped protrusions.

For example, step S2 described above includes: depositing an electrode material layer on the lining substrate, and forming the common electrode pattern and the pixel electrode pattern by a single patterning process on the electrode material layer. In this way, a number of patterning processes is reduced, and difficulty in fabrication is lowered.

After step S2, the method described above for example further comprises: forming a material of the alignment film above the lining substrate and the electrode pattern; and rubbing the material of the alignment film along the extending direction of the strip-shaped protrusions to obtain the alignment film.

In this way, the rubbing process described above is prevented from being affected by a height difference of the lining substrate caused by the strip-shaped protrusions, thereby avoiding light leakage phenomenon.

Example 2

Figure 5:
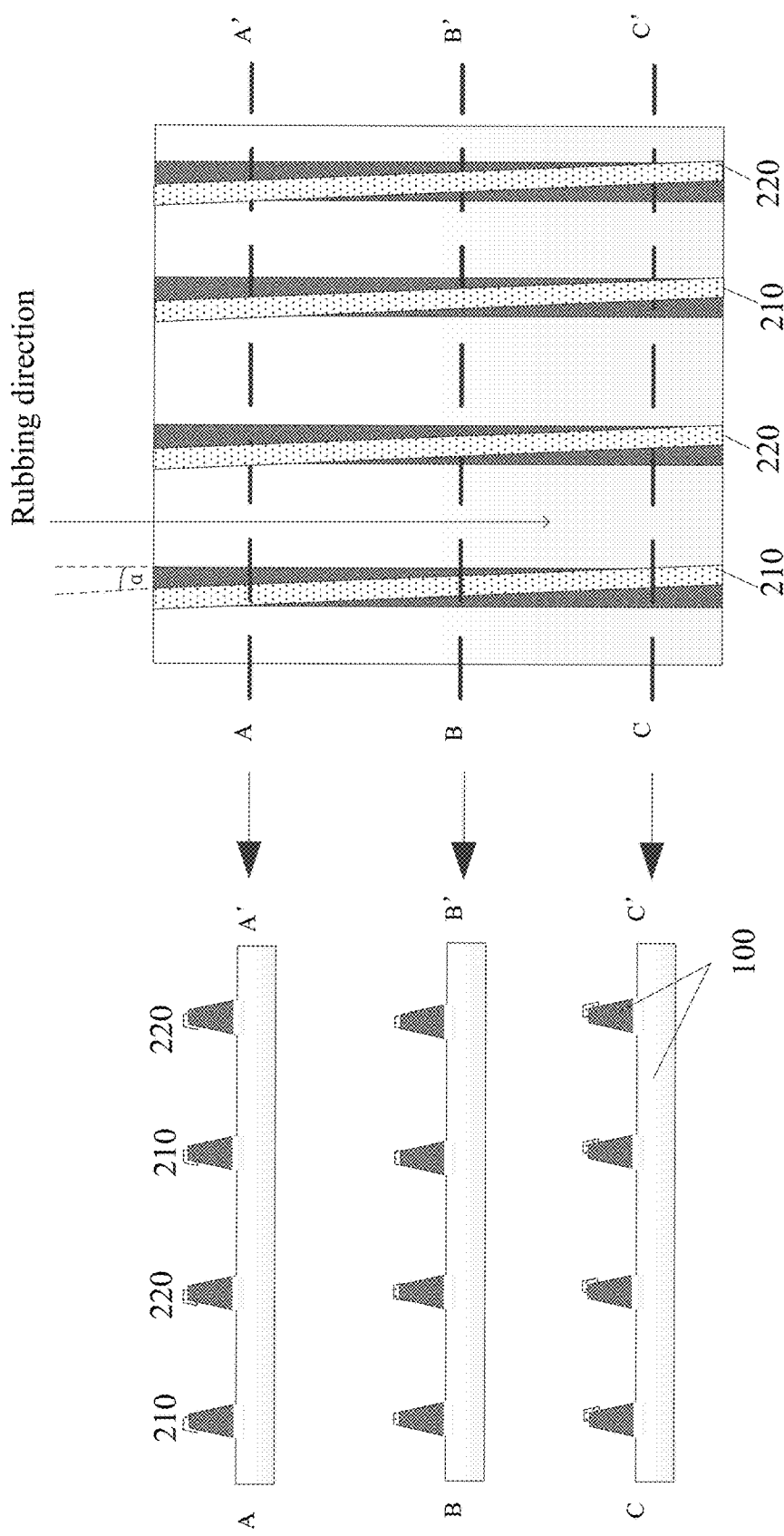
FIG. 5 is a structural schematic diagram of the array substrate provided by Example 2 of the embodiments of the present disclosure.

Referring to FIG. 5, it is different from Example 1 in that, in the array substrate provided by Example 2, the width of each strip-shaped electrode 210 and 220 is less than the width of its corresponding strip-shaped protrusion.

The array substrate in FIG. 5 also achieves purposes required in the embodiments of the present disclosure. In addition, in the case that the width of each strip-shaped electrode is equal to the width of its strip-shaped protrusion, the array substrate also achieves the purposes required in the embodiments of the present disclosure. Therefore, a size relationship between the width of the strip-shaped electrode 210 and 220 and the width of its corresponding strip-shaped protrusion does not affect implementation of the embodiments of the present disclosure.

A fabrication method of the array substrate of Example 2 may refer to the process of fabricating the array substrate of Example 1, which will not be described here in detail.

Example 3

Figure 6:
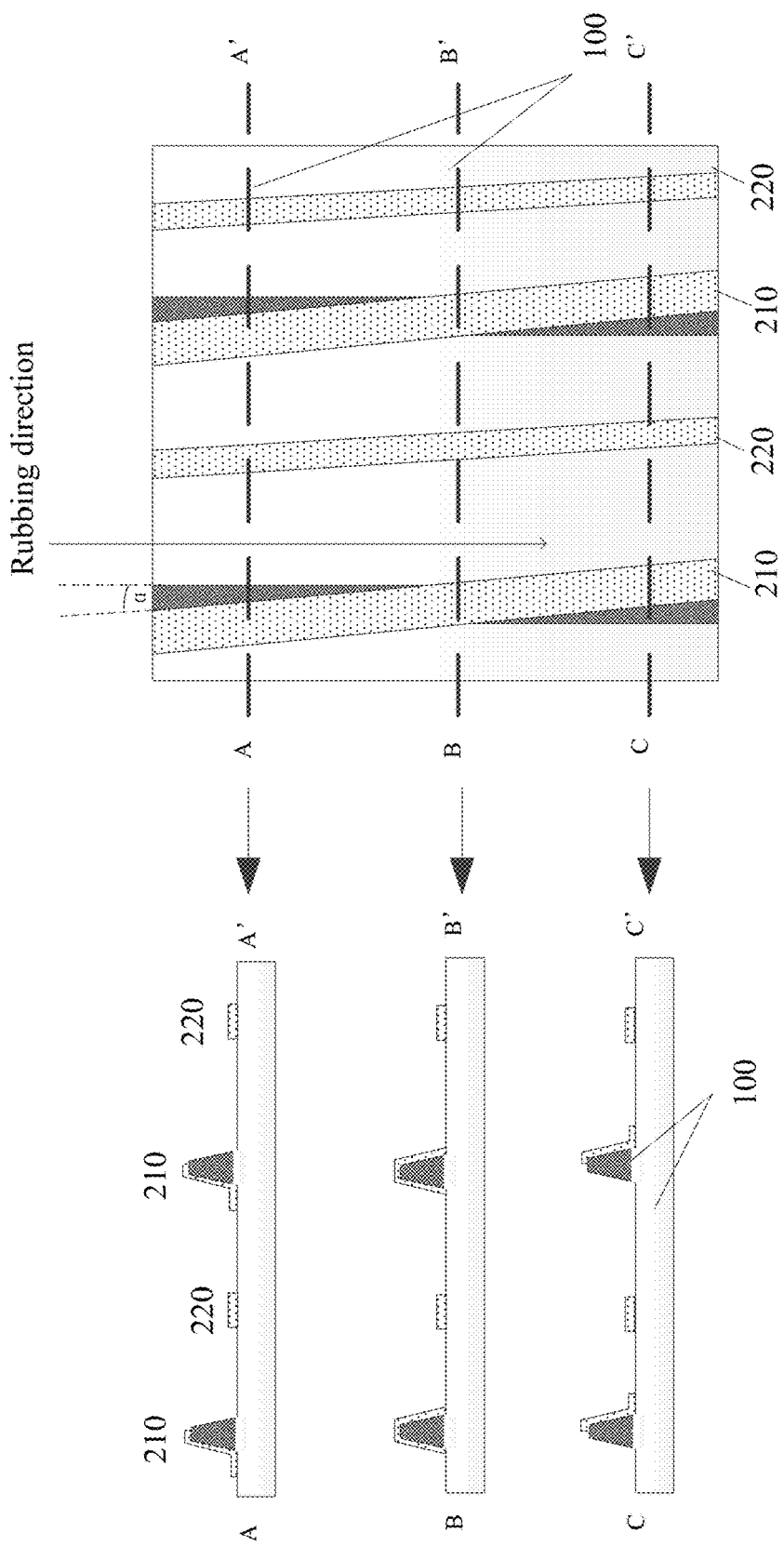
FIG. 6 is a structural schematic diagram of the array substrate provided by Example 3 of the embodiments of the present disclosure.

Referring to FIG. 6, it is different from Example 1 in that, in the array substrate provided by Example 3, only the pixel electrodes 210 are formed on the strip-shaped protrusions one-to-one, the common electrodes 220 are not formed on the strip-shaped protrusions, and the width of the common electrodes 220 is less than the width of the strip-shaped protrusions.

Such arrangement not only achieves the purposes required in the embodiments of the present disclosure, but also makes the display device have better response speed.

For example, the common electrodes 220 are formed on the strip-shaped protrusions one-to-one, but the pixel electrodes 210 are not formed on the strip-shaped protrusions.

A fabrication method of the array substrate of Example 3 may refer to the process of fabricating the array substrate of Example 1, which will not be described here in detail.

Example 4

Figure 7:
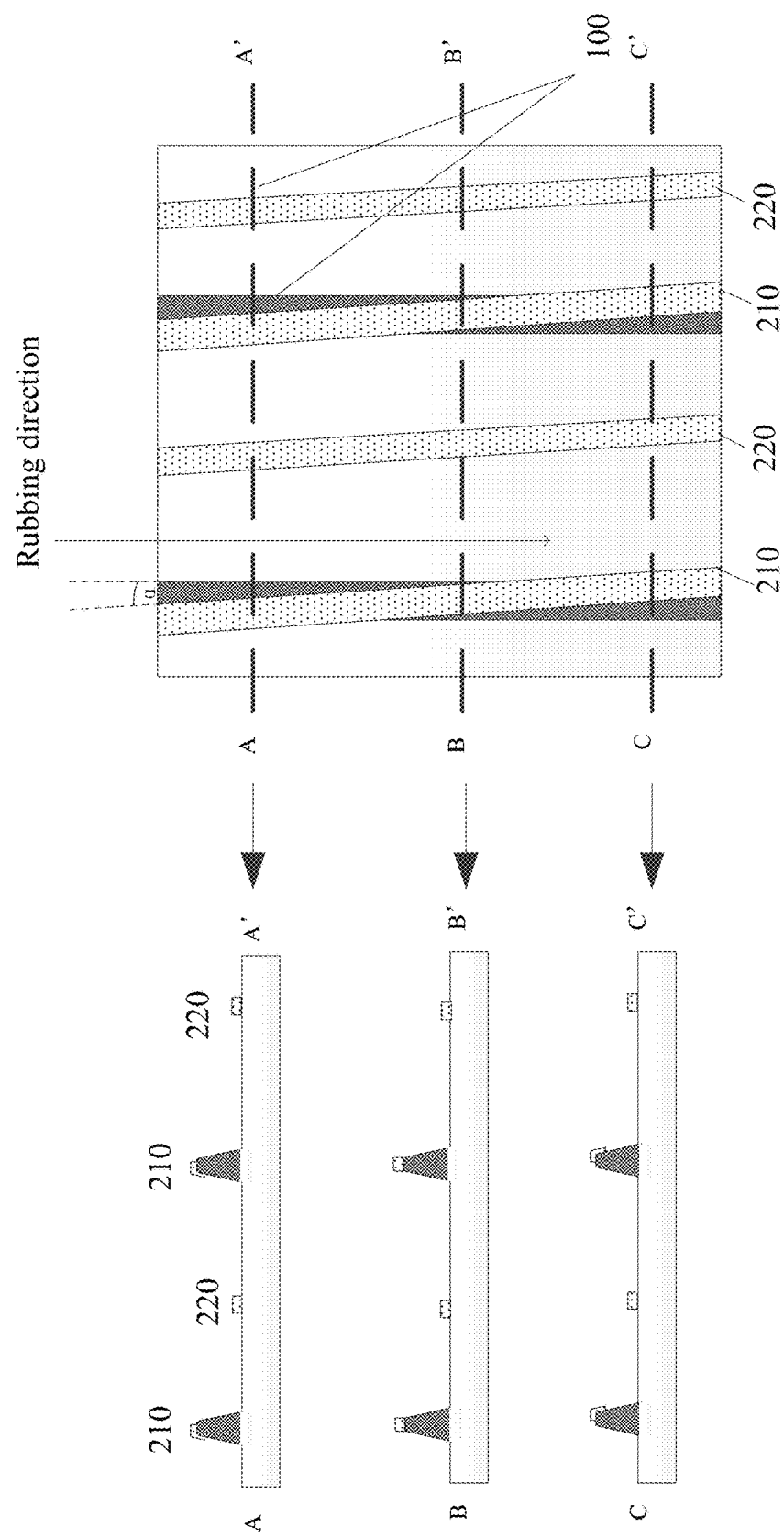
FIG. 7 is a structural schematic diagram of the array substrate provided by Example 4 of the embodiments of the present disclosure.

Referring to FIG. 7, it is different from Example 3 in that, in the array substrate provided by Example 4, both widths of the pixel electrodes 210 and the common electrodes 220 are less than the width of the strip-shaped protrusions.

The array substrate provided by Example 4 also achieves the purposes required in the embodiments of the present disclosure. A fabrication method of the array substrate of Example 4 may refer to the process of fabricating the array substrate of Example 1, which will not be described here in detail.

In addition, it is found in an analog simulation that, compared to a conventional array substrate of IPS mode, a value of a capacitance between the pixel electrode and the common electrode is significantly increased in the array substrate provided by the embodiments of the present disclosure, so that it is not necessary to fabricate a storage capacitance Cst for storing voltage of the pixel electrode. For example, for a 46-inch array substrate of IPS mode, the value of the capacitance between the pixel electrode and the common electrode is about 0.05 pF; and in the array substrate provided by the embodiments of the present disclosure, the value of the capacitance between the pixel electrode and the common electrode is about 0.1 to 0.3 pF, the value of the capacitance is significantly increased; in this way, it is not necessary to fabricate the storage capacitance Cst additionally, which reduces difficulty in design and fabrication. In addition, in the case that the storage capacitance Cst is fabricated, the value of the capacitance between the pixel electrode and the common electrode is reduced, which reduces space occupied by the pixel electrode and the common electrode, and also reduces difficulty in design and fabrication.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201510719680.7 filed on Oct. 29, 2015, the present disclosure of which is incorporated herein by reference in its entirety as part of the present application.

The invention claimed is:

1. An array substrate, comprising a lining substrate, an electrode pattern on the lining substrate, and an alignment film on the electrode pattern, wherein,
    the electrode pattern includes a plurality of strip-shaped electrodes;
    a plurality of strip-shaped protrusions are on an upper surface of the lining substrate, and at least part of strip-shaped electrodes among the plurality of strip-shaped electrodes are on the strip-shaped protrusions, one-to-one;
    an included angle larger than zero is between an extending direction of the strip-shaped electrodes and an extending direction of the strip-shaped protrusions; and
    a rubbing direction of the alignment film is along the extending direction of the strip-shaped protrusions so that an included angle between the rubbing direction of the alignment film and the extending direction of the strip-shaped electrodes is equal to the included angle larger than zero between the extending direction of the strip-shaped electrodes and the extending direction of the strip-shaped protrusions.

2. The array substrate according to claim 1, wherein, the electrode pattern includes a common electrode pattern and/or a pixel electrode pattern.

3. The array substrate according to claim 1, wherein, the lining substrate includes a base substrate, an array of a thin film transistor on the base substrate, and a passivation layer on the array of the thin film transistor; and the plurality of strip-shaped protrusions are on an upper surface of the passivation layer.

4. The array substrate according to claim 3, wherein, the array of the thin film transistor includes a gate insulating layer; and the strip-shaped protrusions are composed by the passivation layer and the gate insulating layer.

5. The array substrate according to claim 1, wherein, the included angle is less than 10.5° and greater than 9.5°.

6. The array substrate according to claim 1, wherein, the alignment film is formed by rubbing a material of the alignment film along the extending direction of the strip-shaped protrusions.

7. The array substrate according to claim 2, wherein, pixel electrodes of the pixel electrode pattern are on the strip-shaped protrusions, and common electrodes of the common electrode pattern are not on the strip-shaped protrusions.

8. The array substrate according to claim 2, wherein, common electrodes of the common electrode pattern are on the strip-shaped protrusions, and pixel electrodes of the pixel electrode pattern are not on the strip-shaped protrusions.

9. A fabrication method of an array substrate, comprising:
    providing a lining substrate having a plurality of strip-shaped protrusions on an upper surface thereof;
    forming an electrode pattern on the lining substrate; and
    forming an alignment film on the electrode pattern, wherein
    the electrode pattern includes a plurality of strip-shaped electrodes, and at least part of strip-shaped electrodes among the plurality of strip-shaped electrodes are formed on the strip-shaped protrusions, one-to-one;
    an included angle larger than zero is between an extending direction of the strip-shaped electrodes and an extending direction of the strip-shaped protrusions; and
    a rubbing direction of the alignment film is along the extending direction of the strip-shaped protrusions so that an included angle between the rubbing direction of the alignment film and the extending direction of the strip-shaped electrodes is equal to the included angle larger than zero between the extending direction of the strip-shaped electrodes and the extending direction of the strip-shaped protrusions.

10. The method according to claim 9, wherein, the electrode pattern includes a common electrode pattern and/or a pixel electrode pattern.

11. The method according to claim 9, wherein, the included angle is less than 10.5° and greater than 9.5°.

12. The method according to claim 9, further comprising:
    forming a material of the alignment film above the lining substrate and the electrode pattern; and
    rubbing the material of the alignment film along the extending direction of the strip-shaped protrusions to obtain the alignment film.

13. A display device, comprising the array substrate according to claim 1.

* * * * *